(12) United States Patent
Tseng

(10) Patent No.: US 6,791,142 B2
(45) Date of Patent: Sep. 14, 2004

(54) STACKED-GATE FLASH MEMORY AND THE METHOD OF MAKING THE SAME

(75) Inventor: Horng-Huei Tseng, Hsinchu (TW)

(73) Assignee: Vanguard International Semiconductor Co., Hsinchu (TW)

(*) Notice: Subject to any disclaimer, the term of this patent is extended or adjusted under 35 U.S.C. 154(b) by 430 days.

(21) Appl. No.: 09/846,470

(22) Filed: Apr. 30, 2001

(65) Prior Publication Data

US 2002/0160570 A1 Oct. 31, 2002

(51) Int. Cl.[7] .............................................. H01L 29/788
(52) U.S. Cl. .................... 257/316; 438/257; 438/267; 438/258; 438/261; 438/424; 438/294; 438/296; 438/211; 365/185.16; 257/315; 257/314; 257/317; 257/390; 257/401; 257/321
(58) Field of Search ................................. 438/257, 267, 438/258, 261, 424, 294, 296, 211; 257/316, 315, 314, 317, 390, 401, 321

(56) References Cited

U.S. PATENT DOCUMENTS

| 6,130,129 A | * | 10/2000 | Chen | 438/257 |
| 6,171,909 B1 | * | 1/2001 | Ding et al. | 438/267 |
| 6,200,856 B1 | * | 3/2001 | Chen | 438/257 |
| 6,326,263 B1 | * | 12/2001 | Hsieh | 438/257 |
| 6,436,765 B1 | * | 8/2002 | Liou et al. | 438/259 |

* cited by examiner

Primary Examiner—Matthew Smith
Assistant Examiner—Victor Yevsikov
(74) Attorney, Agent, or Firm—Clement Cheng

(57) ABSTRACT

A method for manufacturing a flash memory comprises forming a first dielectric layer on a semiconductor substrate as a tunneling dielectric and forming a first conductive layer on the first dielectric layer. Next step is to pattern the first dielectric layer, the first conductive layer and the substrate to form a trench in the substrate. An isolation is refilled into the trench, a portion of isolation is removed to a surface of the first conductive layer. A portion of the first conductive layer is removed, thereby forming a cavity between adjacent isolation. A second conductive layer is formed along a surface of the cavity and the isolation, next, a portion of the second conductive layer is removed to a surface of the isolation. Subsequently, a second dielectric layer is formed on a surface of the floating gate, a third conductive layer is formed on the second dielectric layer as a control gate.

6 Claims, 1 Drawing Sheet

STACKED-GATE FLASH MEMORY AND THE METHOD OF MAKING THE SAME

The present invention relates to a semiconductor device, and more specifically, to a flash memory and the method of fabricating the nonvolatile memory.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The high-density nonvolatile memories can be applied as the mass storage of portable handy terminals, solid state camera and PC cards. That is because that the nonvolatile memories exhibit many advantages, such as a fast access time, low power dissipation, and robustness. Further, it can be used to replace magnetic disk memory. The nonvolatile memories include various types of devices, such as EAROM (electrically alterable read only memory), EEPROM (electrically erasable programmable read only memory), EEPROM-EAROMs and non-volatile SRAMs.

Different types of devices have been developed for specific applications requirements in each of the segments of memory. In the device, electrical alterability is achieved by Fowler-Nordheim tunneling which is cold electron tunneling through the energy barrier at a silicon-thin dielectric interface and into the oxide conduction band. Typically, the thin dielectric layer is composed of silicon dioxide and the thin silicon dioxide layer allows charges to tunnel through when a voltage is applied to the gate. These charges are trapped in the silicon dioxide and remain trapped there since the materials are high quality insulators. A conventional flash memory is a type of erasable programmable read-only memory (EPROM). One of the advantages of flash memory is its capacity for block-by-block memory erasure. Furthermore, the speed of memory erasure is fast. For other EPROM, the memory erasure can take up to several minutes due to the erase mode of such type memory is done by bit-by-bit.

Various flash memories have been disclosed in the prior art, the type of the flash includes separated-gate and stacked-gate structure. U.S. Pat. No. 6,180,454 to Chang, et al, entitled "Method for forming flash memory devices", and filed on Oct. 29, 1999. A further U.S. Pat. No. 6,153,906 to Chang, filed on Dec. 8, 1998. The device includes an oxide layer on a substrate. A stacked gate is formed on the substrate. A tunnel diffusion region is formed in the substrate next to a first side of the stacked gate. The tunnel diffusion region extends to a portion of the substrate under the stacked gate. A doped region is formed in the substrate next to a second side of the stacked gate. The doped region is distant away from the stacked gate by a lateral distance. U.S. Pat. No. 5,956,268 disclosed a Nonvolatile memory structure. The prior art allows for array, block eraseing capabilities.

U.S. Pat. No. 6,153,494 to Hsieh, et al., entitled "Method to increase the coupling ratio of word line to floating gate by lateral coupling in stacked-gate flash" and filed on May 12, 1999. The object of this invention is to provide a method of forming a stacked-gate flash memory having a shallow trench isolation with a high-step in order to increase the lateral coupling between the word line and the floating gate. Hsieh disclosed a step of forming nitride layer and then forming shallow trench isolation (STI) through the nitride layer into the substrate. Then, oxide is filled into the STI, the nitride is then removed leaving behind a deep opening about the filled STI. The detailed description may refer to the prior art. A stacked-gate flash memory cell is provided having a shallow trench isolation with a high-step of oxide and high lateral coupling.

SUMMARY OF THE INVENTION

The object of the present invention is to form flash memory with higher coupling ratio.

It is another object of this invention to provide a method of forming a stacked-gate flash memory having sidewall and lateral coupling to increase the coupling ratio between the control gate and the floating gate of the cell.

The stacked-gate flash memory cell includes a trench formed in a substrate and a tunneling oxide is formed on the substrate. A first part of the floating gate is formed on the tunneling gate. A raised isolation filler is formed in the trench and protruding over the upper surface of the first part of the floating gate, thereby forming a cavity between the two adjacent raised isolation filler. A second part of the floating gate is formed along the surface of the cavity to have a U-shaped structure in cross sectional view. A dielectric layer is conformally formed on the surface of the second part of the floating gate and a control gate is formed on the dielectric layer.

A method for manufacturing flash memory is disclosed. The method comprises forming a first dielectric layer on a semiconductor substrate as a tunneling dielectric and forming a first conductive layer on the first dielectric layer. Next step is to patterns the first dielectric layer, the first conductive layer and the substrate to form a trench in the substrate. An isolation is refilled into the trench, a portion of isolation is removed to a surface of the first conductive layer. A portion of the first conductive layer is removed, thereby forming a cavity between adjacent isolation. A second conductive layer is formed along a surface of the cavity and the isolation, next, a portion of the second conductive layer is removed to a surface of the isolation. Subsequently, a second dielectric layer is formed on a surface of the floating gate, a third conductive layer is formed on the second dielectric layer as a control gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
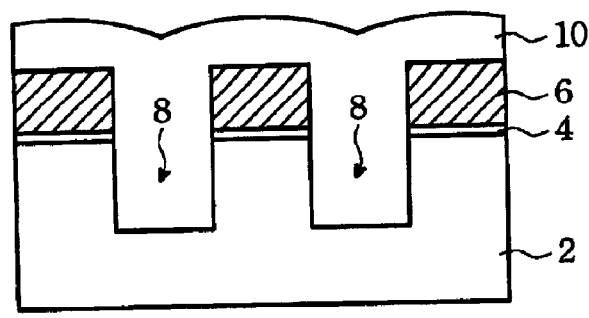
FIG. 1 is a cross section view of a semiconductor wafer illustrating the steps of forming a trench in a substrate and refilling an isolation therein according to the present invention.

The present invention proposes a novel structure and method to fabricate the flash memory. The stacked-gate flash memory cell includes a trench formed in a substrate 2, please refer to FIG. 4. A tunneling oxide 4 is formed on the surface of the substrate 2 and adjacent to the trench 4. A first part of the floating gate 6 is formed on the tunneling gate oxide 4. A raised (protruding) isolation filler 10 is formed in the trench and protruding over the upper surface of the first part of the floating gate 6, thereby forming a cavity 9 between the two adjacent raised isolation filler 10. A second part of the floating gate 12 is formed along the surface of the cavity to have a U-shaped structure in cross sectional view. The high level of the U-shaped structure is the same with the one of the raised isolation filler 10. a dielectric layer 14 is conformally formed on the surface of the second part of the floating gate 12 and a control gate 16 is formed on the dielectric layer 14.

The method of forming the device is described as follows. In the method, a trench is formed and a floating gate is formed in the trench to increase the coupling ratio. The detail description of the method will be seen as follows. In a preferred embodiment, as shown in the FIG. 1, a single crystal silicon substrate 2 with a <100> or <111> crystallographic orientation is provided. A dielectric such as oxide layer 4 is formed on the substrate 2 as tunneling dielectric layer. Typically, the oxide 4 can be grown in oxygen ambient in a furnace at a temperature of about 800 to 1100 degrees centigrade. The thickness of the silicon oxide layer 4 is about 50 to 500 angstroms. Other method, such as chemical vapor deposition, can be used to form the oxide 4. It is appreciated that any suitable material such as silicon oxynitride may be used as the gate dielectric. Preferably, the silicon oxynitride layer is formed by thermal oxidation in $N_2O$ or NO environment. The temperature for forming the silicon oxynitride layer 4 ranges from 700 to 1150 degrees centigrade.

Next, as can be seen by reference to FIG. 1, a conductive layer, such as doped polysilicon layer 6, is formed on the oxide layer 4. The doped polysilicon layer 6 can be chosen from doped polysilicon or in-situ doped polysilicon. This is achieved preferably through a LPCVD method employing silane as a silicon source material at a temperature range between about 500 to 650 degree C. The thickness of the polysilicon is about 2000–6000 angstroms.

Figure 2:
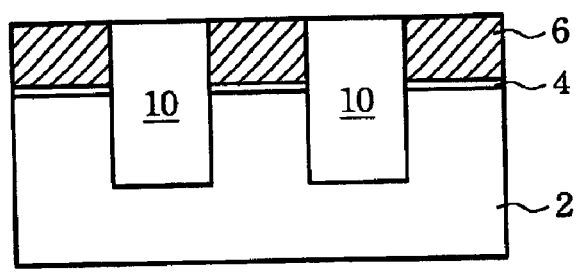
FIG. 2 is a cross section view of a semiconductor wafer illustrating the step of performing CMP according to the present invention.

A photoresist is patterned on the polysilicon 6 to define trench region, followed by etching the polysilicon layer 6, dielectric layer 4 and the substrate 2 to form trench 8 in the substrate 2. The photoresist is next removed by oxygen plasma ashing. Subsequently, the trench 8 is filled with isolation oxide 10, using the method of high density plasma (HDP) deposition or LPCVD. Next, the substrate 2 is subjected to chemical-mechanical polishing (CMP), thus forming shallow trench isolation (STI) 10 as shown in FIG. 2.

Figure 3:
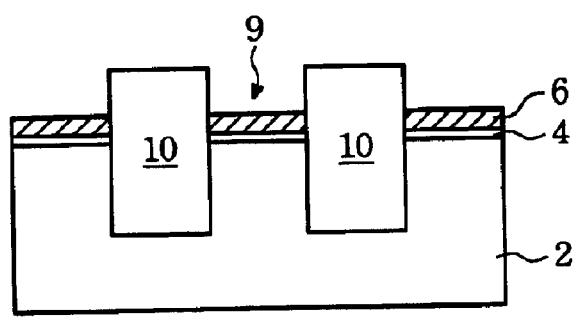
FIG. 3 IS cross section views of a semiconductor wafer illustrating the step of removing a portion of the polysilicon layer according to the present invention.

Next, turning to FIG. 3, a portion of the polysilicon layer 6 is removed to form raised (protruding) isolation filler 10 that protruding over the etched surface the polysilicon 6, thereby forming cavity 9 between the raised isolation fillers 10. A high selectivity etching between oxide and polysilicon is utilized to this step. The step high of the raised isolation filler 10 can be controlled by the etching depth, namely the amount of the removal of the polysilicon. Next, a thin conductive layer 12 such as in-situ doped polysilicon along the surface of the cavity 9 and the raised (protruding) isolation filler 10. The thickness of the thin conductive layer is about 100–1000 angstroms. Next, the thin conductive layer 12 is removed to expose the upper surface of the raised isolation filler 10 by CMP. The thin polysilicon layer 12 only remains on side wall and bottom of the cavity 9, as shown in FIG. 4.

The polysilicon layer 6 and the remained thin polysilicon layer 12 serve as a floating gate and isolated by the raised isolation filler 10. As another key feature of the present invention, remained thin polysilicon layer 12 is conformally formed so as to follow the contours of the cavity 9, thus providing additional surface to the control gate dielectric that to be formed later. In another words, the polysilicon layer 12 should not be filled the totally the cavity 9.

Figure 4:
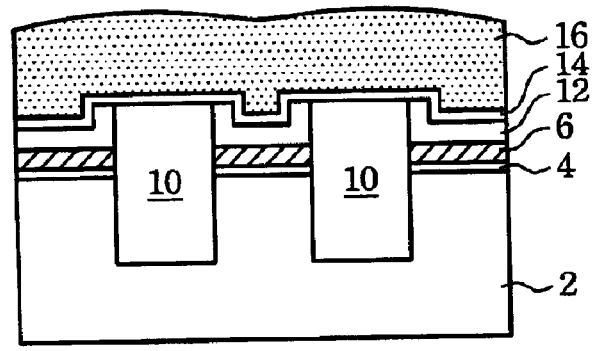
FIG. 4 is a cross section views of a semiconductor wafer illustrating the step of defining control gate according to the present invention.

An interpoly dielectric layer 14 is next formed over the contours of the conformal floating gate and the upper surface of the raised isolation filler 10, as shown in FIG. 4. The.

It is preferred that the interpoly dielectric layer 14 comprises but not limited to oxide/nitride/oxide (ONO), ON. Then, a further polysilicon layer 16 is formed over the interpoly dielectric layer 14 to act as the control gate and word line. Thus, a stacked-gate flash is formed as shown in the cross-sectional view of FIG. 4.

The higher coupling can be obtained due to the floating gate formed against the high-step oxide protruding over the isolation trench of the present invention.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A stacked-gate flash memory comprising:

a substrate having a trench formed therein;

a tunneling oxide formed on a surface of said substrate and adjacent to said trench;

a first part of a floating gate formed on said tunneling oxide;

a raised isolation filler formed in said trench and protruding over an upper surface of said first part of said floating gate, thereby forming a cavity between two adjacent raised isolation filler;

a second part of said floating gate formed along a surface of said cavity to have U-shaped structure in cross sectional view, wherein the high level of said U-shaped structure is the same with the one of said raised isolation filler;

a dielectric layer conformally formed on a surface of said second part of said floating gate; and a control gate formed on said dielectric layer.

2. The stacked-gate flash memory of claim 1, wherein said raised isolation filler includes oxide.

3. The stacked-gate flash memory of claim 1, wherein said first part of said floating fate includes polysilicon.

4. The stacked-gate flash memory of claim 1, wherein said second part of said floating gate includes polysilicon.

5. The stacked-gate flash memory of claim 1, wherein said dielectric layer includes oxide/nitride/oxide.

6. The stacked-gate flash memory of claim 1, wherein said dielectric layer includes oxide/nitride.

* * * * *